(12) United States Patent  
Udrea et al.

(10) Patent No.: US 7,531,993 B2  
(45) Date of Patent: May 12, 2009

(54) HALF BRIDGE CIRCUIT AND METHOD OF OPERATING A HALF BRIDGE CIRCUIT

(75) Inventors: Florin Udrea, Cambridge (GB); Nishad Udugampola, Cambridge (GB); Gehan A. J. Amaratunga, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 118 days.

(21) Appl. No.: 11/847,234

(22) Filed: Aug. 29, 2007

(65) Prior Publication Data

US 2009/0058498 A1 Mar. 5, 2009

(51) Int. Cl.
*G05F 3/16* (2006.01)
*H03K 3/35* (2006.01)

(52) U.S. Cl. ...................... 323/224; 327/429
(58) Field of Classification Search ................. 323/222, 323/223, 224, 265, 282, 351; 327/108, 109, 327/110, 111, 423, 424, 427, 429
See application file for complete search history.

(56) References Cited

U.S. PATENT DOCUMENTS

| | | | |
|---|---|---|---|
| 6,528,976 B1 * | 3/2003 | Lenk et al. ................... | 323/282 |
| 6,703,684 B2 | 3/2004 | Udrea | |
| 6,856,520 B2 * | 2/2005 | Neilson et al. ................ | 363/16 |
| 6,900,518 B2 | 5/2005 | Udrea | |
| 6,927,102 B2 | 8/2005 | Udrea | |
| 7,235,439 B2 | 6/2007 | Udrea | |
| 7,276,883 B2 * | 10/2007 | Soldano ....................... | 323/222 |
| 2005/0242368 A1 | 11/2005 | Udrea | |

FOREIGN PATENT DOCUMENTS

WO 02/25700 3/2002

OTHER PUBLICATIONS

Udrea et al., "The MOS Inversion Layer as a Minority Carrier Injector", IEEE, Electron Device Letters, vol. 17, No. 9, Sep. 1996, pp. 425-427.

Udugampola, et al., "Dual Gate Lateral Inversion Layer. Emitter Transistor for Power and High Voltage Integrated Circuits", International Symposium on power semiconductor devices and ICs, Cambridge 2003, p. 216-219.

(Continued)

*Primary Examiner*—Gary L Laxton
(74) *Attorney, Agent, or Firm*—Pillsbury Winthrop Shaw Pittman, LLP (57) ABSTRACT

A half bridge circuit has a first switch having at least one control gate and a second switch having at least two control gates. A first driver has an output connected to a control gate of the first switch. A second driver has an output connected to a first control gate of the second switch. The output of the first driver is connected to a second control gate of the second switch by a circuit arrangement such that when the first driver is operated to apply a high, positive voltage to the control gate of the first switch, a positive voltage is applied to the second control gate of the second switch, and such that when the first driver is operated to apply a low, zero or small voltage to the control gate of the first switch, a negative voltage is applied to said second control gate of the second switch.

16 Claims, 5 Drawing Sheets

OTHER PUBLICATIONS

Udrea et al., "Experimental Demonstration of an Ultra-Fast Double Gate Inversion Layer Emitter Transistor (DG-ILET)", IEEE Electron Device Letters, vol. 23, No. 12, Dec. 2002, pp. 725-727.

Takahashi et al, "1200 V Reverse Conducting IGBT", ISPSD, 2004, pp. 133-138.

Leedham et al. "Design of a high speed power MOSFET driver and its use in a half-bridge", Power Electronics and Applications, 1993., Fifth European Conference on, Sep. 1993, vol. 2, pp. 407-412.

Reimann et al., "Comparison of 1200 V/50 A State-of-the-Art Half-Bridge IGBT-Modules and MCT", Power Electronics Specialists Conference, 1996. PESC '96 Record., 27th Annual IEEE, Jun. 1996, vol. 1, pp. 620-626.

Udugampola, et al., "Dual Gate Lateral Inversion Layer Emitter Transistor for Power and High Voltage Integrated Circuits", International Symposium on power semiconductor devices and ICs, Cambridge, pp. 216-219. Apr. 2003.

* cited by examiner

HALF BRIDGE CIRCUIT AND METHOD OF OPERATING A HALF BRIDGE CIRCUIT

The present invention relates to a half bridge circuit and to a method of operating a half bridge circuit.

In a typical half bridge circuit, two transistor switches are operated in alternating fashion so that as one switch is on, the other is off and vice versa. One switch is conventionally termed the "high side switch" and has one output connected to a high voltage supply line and another to a midpoint of the half bridge circuit. The other switch is conventionally termed the "low side switch" and has one output connected to a low voltage supply line and another to the midpoint of the half bridge circuit. Separate driver circuits are provided to provide appropriate control signals to the gates of the high and low side switches. Half bridge circuits have numerous applications, including for example use in converting a DC voltage to a high frequency AC voltage, and are useful in switched mode power supplies, DC-AC converters, drivers for display device (such as plasma panels), etc. Two half bridge circuits may be combined to form a full bridge circuit, again as known per se.

Power devices operated in integrated circuits typically operate with a voltage in the range 20V to 1.2 kV and typically higher than 30V or 50V or so. Power devices typically operate with a current in the range 10 mA to 50 A and typically higher than 0.1 A and smaller than 5 A. Such devices may also be referred to as "high voltage/power devices". These devices are typically capable of delivering from a few mWatts to 1 Watt or even a few tens of Watts of power. Their application may range from domestic appliances, electric cars, motor control, and power supplies to RF and microwave circuits and telecommunication systems.

It will be appreciated that the terms "top" and "bottom", "above" and "below", and "lateral" and "vertical", may be used in this specification by convention and that no particular physical orientation of the device as a whole is implied.

Lateral devices in integrated circuits have the main terminals (variously called the anode/cathode, drain/source and emitter/collector) and the control terminals (termed the gate or base) placed at the top surface of the device in order to be easily accessible. In power ICs, such devices are often monolithically integrated with CMOS-type or BiCMOS-type low voltage/low power circuits. It is desirable that several high voltage/power devices are integrated within the same chip.

MOS bipolar power devices, such as the lateral insulated gate bipolar transistor (LIGBT), are based on MOS control with bipolar current conduction in the lowly-doped drift layer or region of the device. Such devices are based on the conductivity modulation concept. At high levels of charge injection, when the current in the device increases, a mobile charge of electrons and of holes is built up in the drift layer, leading to a desirably sharp increase in the conductivity of the drift layer. The mobile charge accumulated when the device is in the on-state dictates the on-state/switching performance of the device given that the mobile carriers must be removed or "mopped up" in order to switch the device to the off-state.

MOS-bipolar devices, such as the LIGBT, can be broadly regarded as a low voltage MOS component driving a wide base (high voltage) bipolar transistor. By way of example, an n-channel LIGBT has an n-channel MOSFET driving the base of a pnp transistor. Such devices do not normally have reverse current conduction because, unlike in a MOSFET (or power MOSFET), there is no associated integral body diode. As is known, the integral body diode in a MOSFET is an intrinsic component of the MOS transistor and is connected in an anti-parallel configuration and allows for reverse current conduction.

In some applications and some architectures, such as half bridges or full bridges, reverse current conduction is necessary. In this respect, therefore, the MOSFET has an advantage over the IGBT in such applications as it has an intrinsic anti-parallel body diode.

Anode-shorted IGBTs are based on a combination of a MOSFET with an IGBT. They behave as MOSFETs until a certain current threshold is reached, above which they operate as an IGBT. These devices are generally faster than the conventional IGBTs and feature a body diode. A significant drawback of such arrangements however is that a sharp snap-back is seen in the output characteristics when the device commutes from the MOSFET mode (unipolar mode) to the IGBT mode (bipolar mode). There is therefore a very difficult trade-off in anode-shorted devices between the IGBT and the body diode performance. In general, a high performance diode comes with a significant snap-back and thus is an unacceptable solution. Reducing the snap-back however kills the diode output power to an extent that is almost un-usable.

A dual gate MOS-bipolar device is a high voltage device that is controlled by two MOS gates. Most dual gate devices have the respective gates referred to separate electrodes (i.e. the source and drain respectively).

Examples of anode-shorted IGBTs or double gate devices are disclosed in F. Udrea, G. A. J. Amaratunga, J. Humphrey, J. Clark and A. Evans, "The MOS Inversion Layer as a Minority Carrier Injector", IEEE, Electron Device Letters, volume 17, no. 9, p. 425, September 1996; U. N. K. Udugampola, R. A. McMahon, F. Udrea, K. Sheng, G. A. J. Amaratunga, E. M. S. Narayanan, S. Hardikar, and M. M. De Souza, "Dual Gate Lateral Inversion Layer Emitter Transistor for Power and High Voltage Integrated Circuits", International Symposium on power semiconductor devices and ICs, Cambridge 2003, p. 216-219; F. Udrea, U. N. K. Udugampola, K. Sheng, R. A. McMahon, G. A. J. Amaratunga, E. M. S. Narayanan, M. M. De Souza, and S. Hardikar, "Experimental Demonstration of an Ultra-fast Double Gate Inversion Layer Emitter Transistor (DG-ILET)", IEEE Electron Device Letters, Volume 23, Issue 12, December 2002, p. 725-727; and H. Takahashi et al, "1200 V Reverse Conducting IGBT", ISPSD, p. 133, 2004.

In our copending U.S. patent application Ser. No. 11/486377 filed 14 Jul. 2006, the entire content of which is hereby incorporated by reference, there is disclosed inter alia a dual gate device which, by applying appropriate voltages to the two insulated gates and the cathode and anode gates, can selectively conduct current in the forward direction and the reverse direction, operating respectively in IGBT mode and diode mode. The cathode gate can be operated concomitantly with the anode gate. For example, for the IGBT to turn on for forward conduction, the cathode gate may be switched with respect to the cathode from 0V to +5V while the anode gate is switched with respect to the anode from 0V to −5V. For the IGBT to be turned off and the diode to be turned on for reverse conduction, the cathode gate may be switched from 5V to 0V (or less commonly −5 V) while the anode gate is switched from −5V to +5V. This device, which may be termed a dual gate inversion layer emitter transistor (DGILET), can actually operate in unipolar or bipolar mode during forward conduction depending on the voltages applied to the various electrodes and gates. When the DGILET is operating in the unipolar mode, resembling a MOSFET, it has fast switching characteristics but low on-state current densities. On the other hand, in its bipolar mode of conduction, the device can operate with high on-state current densities but slower switching speeds. The second gate of the DGILET, which is referenced to the anode terminal of the device, enables switching between these two modes of operation, allowing the user to take advantage of these characteristics as required at different parts of operating cycle. As discussed further in our copending U.S. patent application Ser. No. 11/486377, the DGILET has an inherent body diode. This inherent diode can be used as the freewheeling diode when the DGILET is used as a low side switch in a half-bridge converter or other half bridge device, allowing the dedicated diode that is conventionally provided to be omitted. The characteristics of the DGILET both in forward (IGBT mode) and reverse (diode mode) conduction can be controlled by changing the bias voltage on the second gate.

Figure 1:
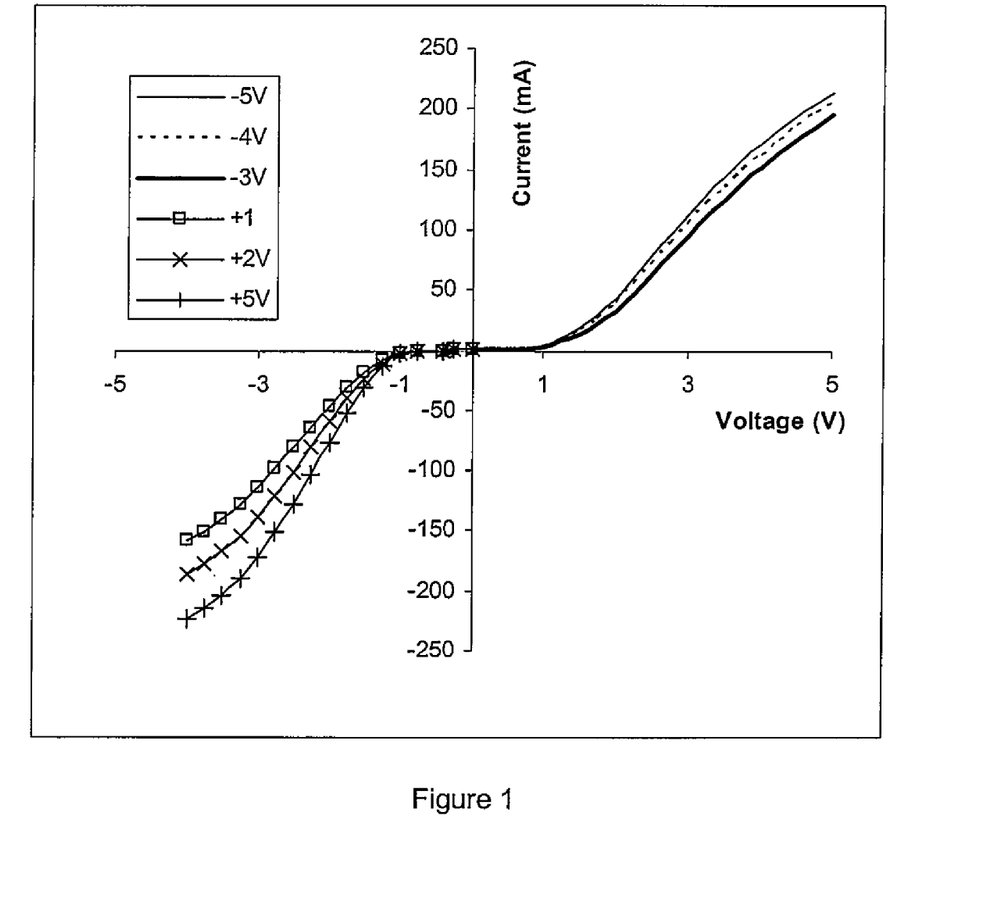
FIG. 1 shows an experimental demonstration of the output characteristics of a DGILET.

An experimental demonstration of the output characteristics of a DGILET is shown in FIG. 1. It can be seen that with increasing negative voltages on the anode gate, the current density in the IGBT mode is increased. Similarly, with increasing positive voltages on the anode gate, the current density of the body diode is increased. The sensitivity of these current densities to the gate voltage can be adjusted by the design of the device as a whole.

Figure 2:
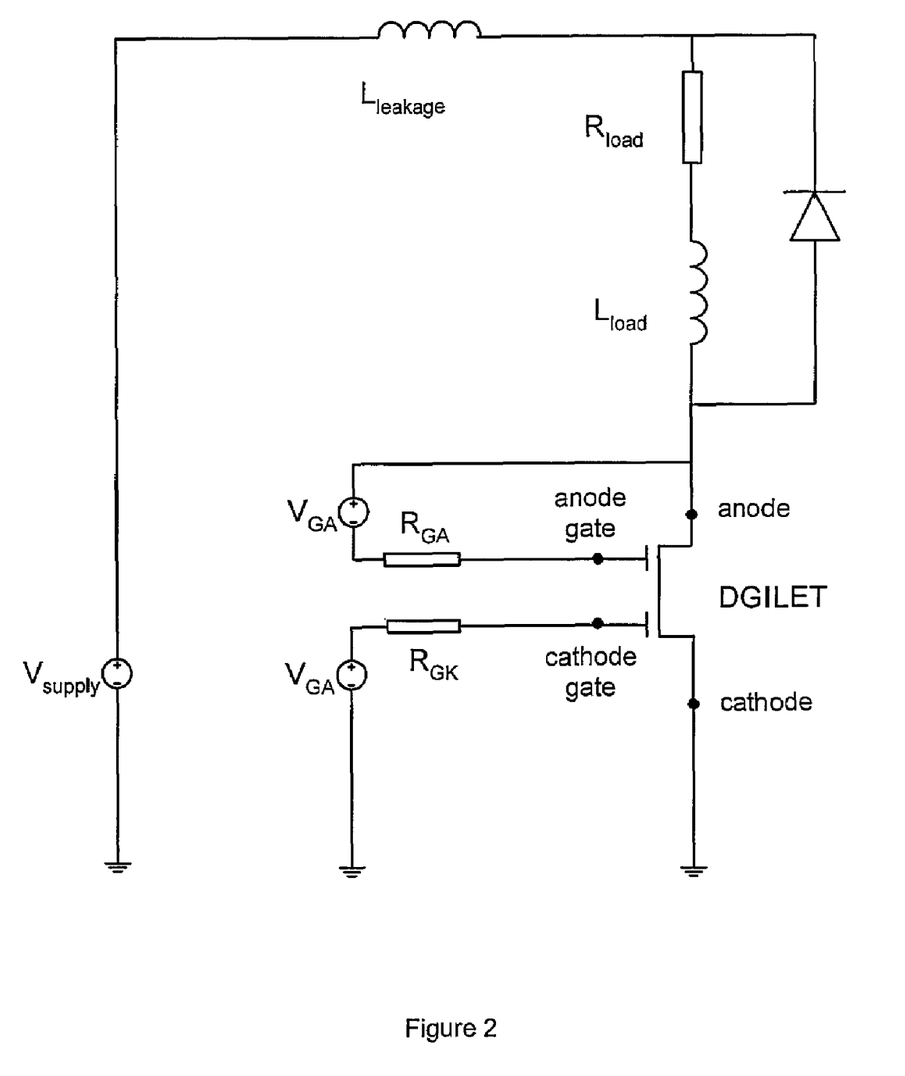
FIG. 2 shows schematically the use of a DGILET in a standard chopper circuit.

Double gate devices, such as the DGILET discussed above but including in general all double gate devices, typically require that the second gate is biased with respect to the high voltage terminal of the device. Conventionally, this has been achieved using a high side gate driver arrangement with level shifting devices or optocouplers or other similar arrangements. However, this additional circuitry and components increase the cost and complexity of the device and makes it more difficult to control the operation of the device. An example of this is shown schematically in FIG. 2 which shows use of a DGILET in a standard chopper circuit. The high side (anode) gate driver is referenced to the anode of the device and requires a level shifting arrangement.

Thus, whist it would be beneficial to be able to use a double gate device as one of the semiconductor switches of a half bridge circuit, this has historically not been practical because of the need to provide special complex and/or costly driving arrangements for the second gate of the device.

According to a first aspect of the present invention, there is provided a half bridge circuit, the circuit comprising:

a first semiconductor switch having at least one control gate;

a second semiconductor switch having at least two control gates;

a first driver having an output connected to a control gate of the first semiconductor switch for selectively applying a first control voltage to the control gate of the first semiconductor switch; and, a second driver having an output connected to a first control gate of the second semiconductor switch for selectively applying a second control voltage to said first control gate of the second semiconductor switch;

the output of the first driver being connected to a second control gate of the second semiconductor switch by a circuit arrangement such that when the first driver is operated to apply a high, positive voltage to the control gate of the first semiconductor switch, a positive voltage is applied to said second control gate of the second semiconductor switch, and such that when the first driver is operated to apply a low, zero or small voltage to the control gate of the first semiconductor switch, a negative voltage is applied to said second control gate of the second semiconductor switch.

This allows use of a double gate device as one of the switches of the half bridge circuit, and thus avoids having to provide a separate additional diode as in conventional half bridge circuits, without requiring additional, complex drive circuitry for both gates of the dual gate device. The same (first) driver can be used to provide control voltages to the control gate of the first semiconductor switch and to the second control gate of the second semiconductor switch. In general, when a relatively high voltage (i.e. a relatively large, positive voltage, of say 5V) is applied to the control gate of the first semiconductor switch, a positive voltage (of up to 5V in this case) is applied to the second control gate of the second semiconductor switch. Also, in general, when a low voltage (i.e. a relatively small positive or small negative or zero voltage) is applied to the control gate of the first semiconductor switch, a negative voltage is applied to the second control gate of the second semiconductor switch.

In a preferred embodiment, the circuit arrangement that connects the output of the first driver to the second control gate of the second semiconductor switch contains passive components only.

In one preferred embodiment, the circuit arrangement that connects the output of the first driver to the second control gate of the second semiconductor switch contains at least one diode and at least one capacitor, one side of the capacitor being connected to the output of the first driver, the other side of the capacitor being connected to the second control gate of the second semiconductor switch, the other side of the capacitor being connected via said at least one diode to a midpoint of the circuit, a high voltage terminal of the second semiconductor switch being connected to the midpoint of the circuit, whereby when the output of the first driver is high, the capacitor charges via said at least one diode so as to present a positive voltage to the second control gate of the second semiconductor switch, and when the output of the first driver is low, the capacitor presents a negative voltage to the second control gate of the second semiconductor switch. This arrangement is particularly simple and inexpensive to implement. The capacitor "automatically" applies a voltage of the correct polarity and an appropriate magnitude to the second control gate of the second semiconductor switch in synchronism with the voltage being applied to the control gate of the first semiconductor switch.

In a preferred embodiment, the second semiconductor switch is a dual gate inversion layer emitter transistor. A dual gate inversion layer emitter transistor is particularly useful in a half bridge circuit because its inherent body diode can be used as the diode that is used to carry freewheeling currents in the circuit and because the forward and reverse conduction modes of the dual gate inversion layer emitter transistor can be controlled to optimise the current-carrying abilities and minimise the switching losses of the dual gate inversion layer emitter transistor.

According to a second aspect of the present invention, there is provided a method of operating a half bridge circuit that has a first semiconductor switch having at least one control gate; a second semiconductor switch, the second semiconductor switch having at least two control gates; a first driver having an output connected to a control gate of the first semiconductor switch for selectively applying a first control voltage to the control gate of the first semiconductor switch; and, a second driver having an output connected to a first control gate of the second semiconductor switch for selectively applying a second control voltage to said first control gate of the second semiconductor switch; the output of the first driver being connected to a second control gate of the second semiconductor switch by a circuit arrangement; the method comprising:

operating the first driver to apply a high, positive voltage to the control gate of the first semiconductor switch, whereby a positive voltage is applied to said second control gate of the second semiconductor switch, and operating the first driver to apply a low, zero or small voltage to the control gate of the first semiconductor switch, whereby a negative voltage is applied to said second control gate of the second semiconductor switch.

Embodiments of the present invention will now be described by way of example with reference to the accompanying drawings, in which.

Figure 3:
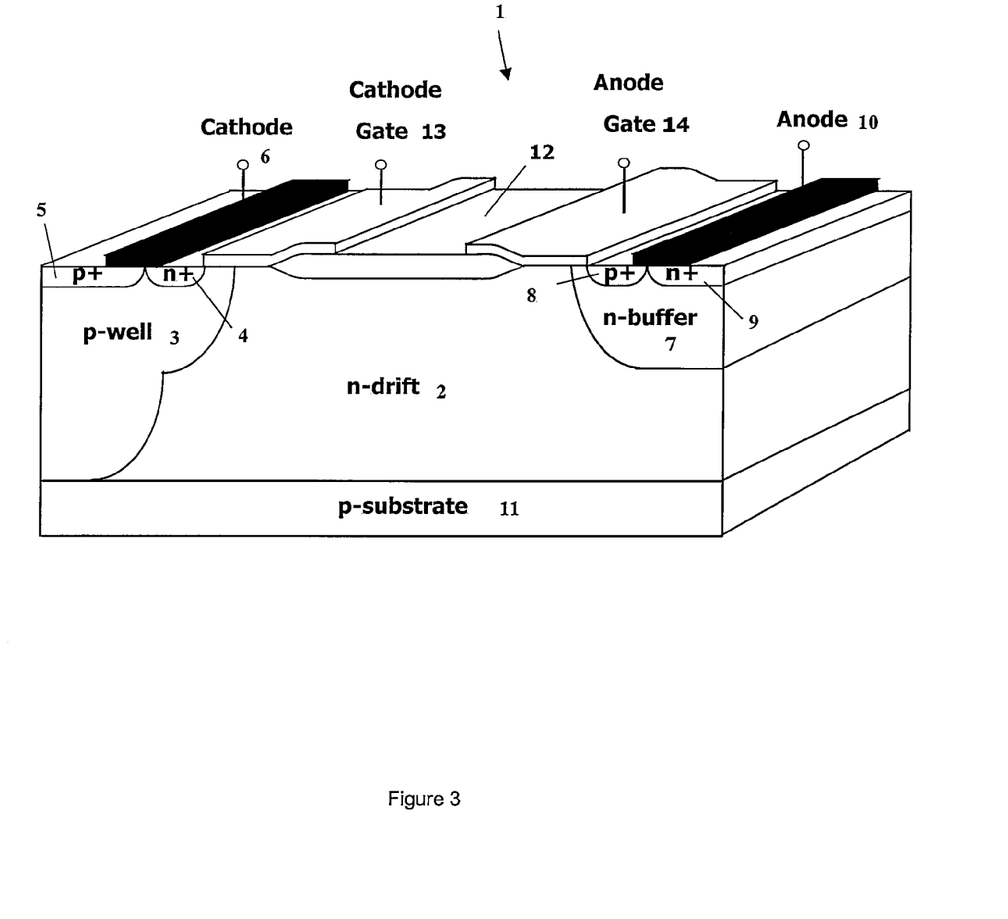
FIG. 3 show schematically a perspective view of an example of a dual gate device suitable for use in a circuit according to an embodiment of the present invention.

Referring now to the drawings, FIG. 3 shows schematically a perspective view of an example of a dual gate device. As discussed more fully in our copending U.S. patent application Ser. No. 11/486377, this particular example is a high voltage/power lateral double insulated-gate bipolar transistor (LIGBT) device 1 though the present invention may in general be applied to or implemented with any dual gate device. This example uses junction isolation technology, which is known per se. The device 1 has an n-drift region 2 having first and second ends.

At the first end of the drift region 2 there is a p-well region 3 which is adjacent to an n+ cathode region 4. In this example, the n+ cathode region 4 is formed in the p-well 3. In this example, a p+ region 5 is also formed in the p-well 3 on the opposite side of the n+ cathode region 4 to the n-drift region 2. A low voltage, "cathode" terminal 6 is in electrical contact with at least a part of the n+ cathode region 4 and, in this example, is also in electrical contact with at least a part of the p+ region 5.

At the second end of the drift region 2 is an n-buffer region or well 7 which is adjacent to a p+ anode region 8. In this example, the p+ anode region 8 is formed in the n-buffer well 7. In this example, an n+ region 9 is also formed in the n-buffer well 7 on the opposite side of the p+ anode region 8 to the n-drift region 2. A high voltage, "anode" terminal 10 is in electrical contact with at least a part of the p+ anode region 8 and, in this example, is also in electrical contact with at least a part of the n+ region 9.

The active layers and regions described above are formed on a p silicon substrate 11.

An insulating layer of silicon oxide 12 is formed over at least a part of the surface of the drift region 2. A first gate electrode 13, termed herein the "cathode gate" 13, is provided towards the first end of the drift region 2 to extend over at least a part of the oxide layer 12 at that end, the adjacent portion of the first end of the drift region 2, a part of the adjacent portion of the p-well 3 and a part of the n+ cathode region 4. A second gate electrode 14, termed herein the "anode gate" 14, is provided towards the second end of the drift region 2 to extend over at least a part of the oxide layer 12 at that end, the adjacent portion of the second end of the drift region 2, a part of the adjacent portion of the n-buffer 7 and a part of the p+ anode region 8.

As discussed more fully in our copending U.S. patent application Ser. No. 11/486377, other arrangements for the dual gate device are possible, including those using thick SOI (silicon-on-insulator) technology for isolation instead of junction isolation, and those using "membrane" technology to improve the electrical field distribution within the drift region 2 in operation. Membrane technology is discussed more fully in our WO-A-02/25700, U.S. Pat. Nos. 6,703,684, 6,900,518, 6,927,102, 7,235,439 and US-A-2005-0242368, and other related patents and patent applications, the entire contents of which are hereby incorporated by reference.

The basic operation of all of these examples is the same. The first, "cathode" gate 13 determines whether the IGBT 1 is on or off. The second, "anode" gate 14 determines whether the IGBT 1 or the diode is active for forward and reverse conduction respectively in the on-state. If the second, "anode" gate 14 is not used (e.g. by being short-circuited to the anode terminal 10), the anode-shorted like structure is obtained. In this mode the device 1 cannot offer a beneficial trade-off between the IGBT on-state performance and the diode on-state performance.

When the second, "anode" gate 14 is biased negatively with respect to the anode terminal 10, a hole inversion layer is formed at the surface of the n-well (n-buffer) 7 and the n-drift region 2 below the insulated second, "anode" gate 14. This leads to (i) reduced snap-back characteristics due to hole injection at lower current densities and (ii) increased emitter area, which leads to slightly higher hole injection and, as a result, lower on-state voltage drop after the snap-back during the on-state. An optimal design of the anode layers can result in a minimal or virtually non-existent snap-back.

If the second, "anode" gate 14 is biased positively with respect to the anode terminal 10, an electron accumulation layer is formed at the surface of the n-well (n-buffer) 7 and the n-drift region 2 below the insulated second, "anode" gate 14. This leads to an enhanced connection of the drift region 2 to the n+ anode region 9 which is shorted to the p+ anode region 8 and in direct contact with the anode terminal 10. The electron accumulation layer facilitates electron injection into the drift region 2, leading to high conductivity modulation and hence good on-state performance during reverse conduction when the device 1 is effectively operating as an anti-parallel diode.

The table below summarises the preferred biasing of the first (cathode) and second (anode) insulated gates for various modes of operation of the device:

| | Cathode potential | Cathode gate with respect to cathode | Anode potential with respect to cathode potential | Anode gate with respect to anode |
|---|---|---|---|---|
| LIGBT ON-state | 0 | + | + | − |
| Anti parallel diode ON-state | 0 | 0 (or −) | − | + |
| LIGBT/Anti parallel diode off state | 0 | 0 (or −) | ++ | 0 |
| LIGBT ON → OFF | 0 | + → 0 (or −) | + → ++ | − → 0 (or +) |
| LIGBT OFF → ON | 0 | 0 (or −) → + | ++ → + | 0 (or +) → − |
| LIGBT → Anti parallel diode transient | 0 | + → 0 (or −) | + → − | − → + |
| Anti parallel | 0 | 0 (or −) → + | − → + | + → − |

-continued

|  | Cathode potential | Cathode gate with respect to cathode | Anode potential with respect to cathode potential | Anode gate with respect to anode |
|---|---|---|---|---|
| diode → LIGBT |  |  |  |  |

An arrow → indicates a time transition from one state to another.
++ refers to a (very) high positive potential (e.g. 300 V).
+ refers to a relatively high positive potential (e.g. +5 V).
− refers to a relatively high negative potential (e.g. −5 V).

Figure 4:
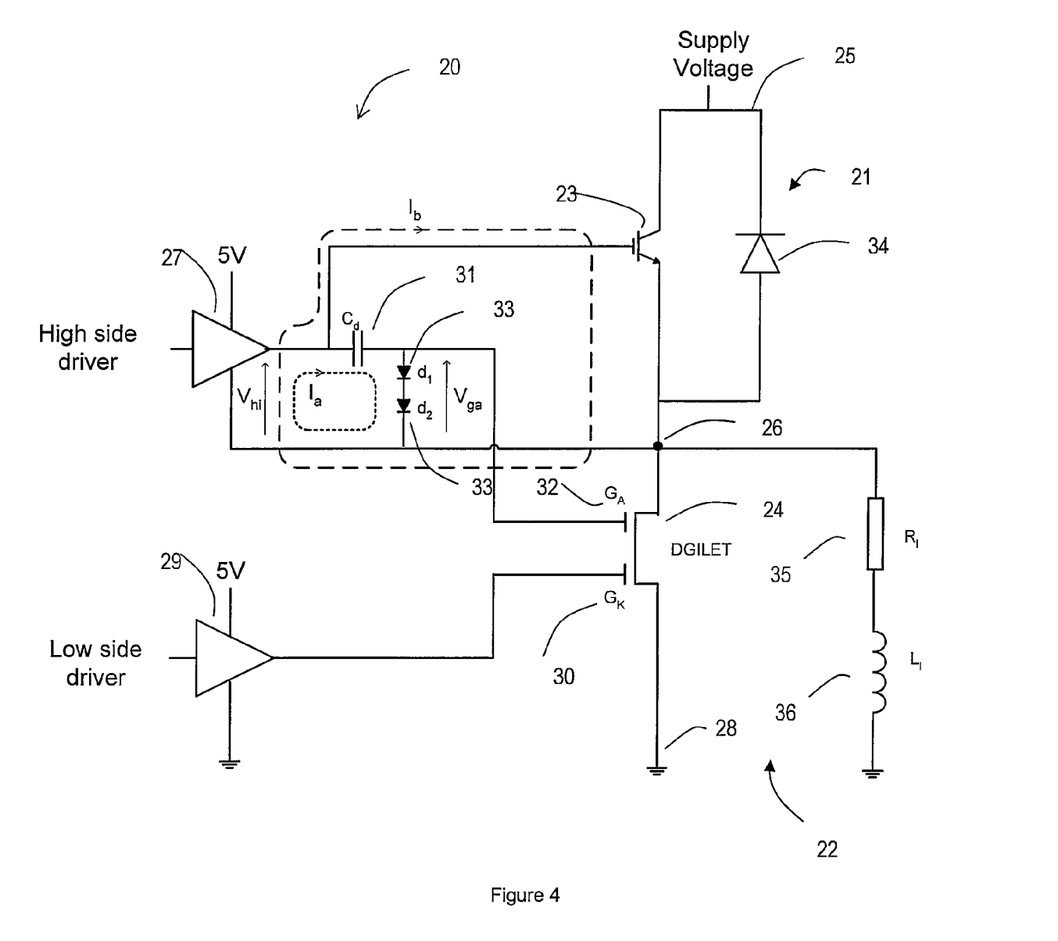
FIG. 4 shows schematically an example of a half bridge in accordance with an embodiment of the present invention; and, FIG. 5 shows a timing diagram of voltages applied to the circuit of FIG. 4.

Referring now to FIG. 4, an example of a half bridge circuit 20 in accordance with an embodiment of the present invention is schematically shown. As is conventional, the half bridge circuit 20 has a high side 21 and a low side 22 having respective high side and low side transistor switches 23, 24. In this particular example, the high side switch 23 may be of any suitable type, and may be for example a field-effect transistor (FET). In accordance with the preferred embodiment of the present invention, the low side switch 24 is a dual gate device. In the currently most preferred embodiment, the low side switch 24 is a DGILET 24 of the type described above. It will be understood however that other types of dual gate device may be used.

The drain of the high side switch 23 is connected to a high voltage supply voltage line 25. The source of the high side switch 23 is connected to the mid point 26 of the half bridge circuit 20. A high side driver 27 is connected to the gate of the high side switch 23 to control the operation of the high side switch 23 by selectively applying a voltage to the gate as will be discussed further below.

The drain of the second transistor switch 24 is connected to the mid point 26 of the half bridge circuit. The source of the second transistor switch 24 is connected to the low voltage supply line or earth 28. A low side driver 29 is connected to the first, low voltage or "cathode" gate 30 of the dual gate low side switch 24.

The output of the high side driver 27 is also connected to one side of a capacitor $C_d$ 31. The other side of the capacitor 31 is connected to the second, high voltage or "anode" gate 32 of the dual gate device 24. In addition, the second side of the capacitor 31 is connected via at least one diode 33 to the mid point 26 of the half bridge circuit 20. The mid point 26 of the half bridge circuit 20 is also connected to the high side driver 27.

Other components that are conventionally provided in half bridge circuits, such as a diode 34 between the drain and source of the high side switch 23 and resistor and inductor elements 35, 36 provided between the mid point 26 and earth, may also be provided but will not be described further herein.

In brief, the circuit 20 of FIG. 4 operates such that an appropriate drive signal is applied to the anode gate 32 of the dual gate device 24 concomitantly with the high side signal that is provided to the control gate of the high side switch 23. The capacitor 31 and one or more diodes 33 act to ensure that the voltage applied to the anode gate 32 of the dual gate device 24 is of the correct magnitude and polarity.

Figure 5:
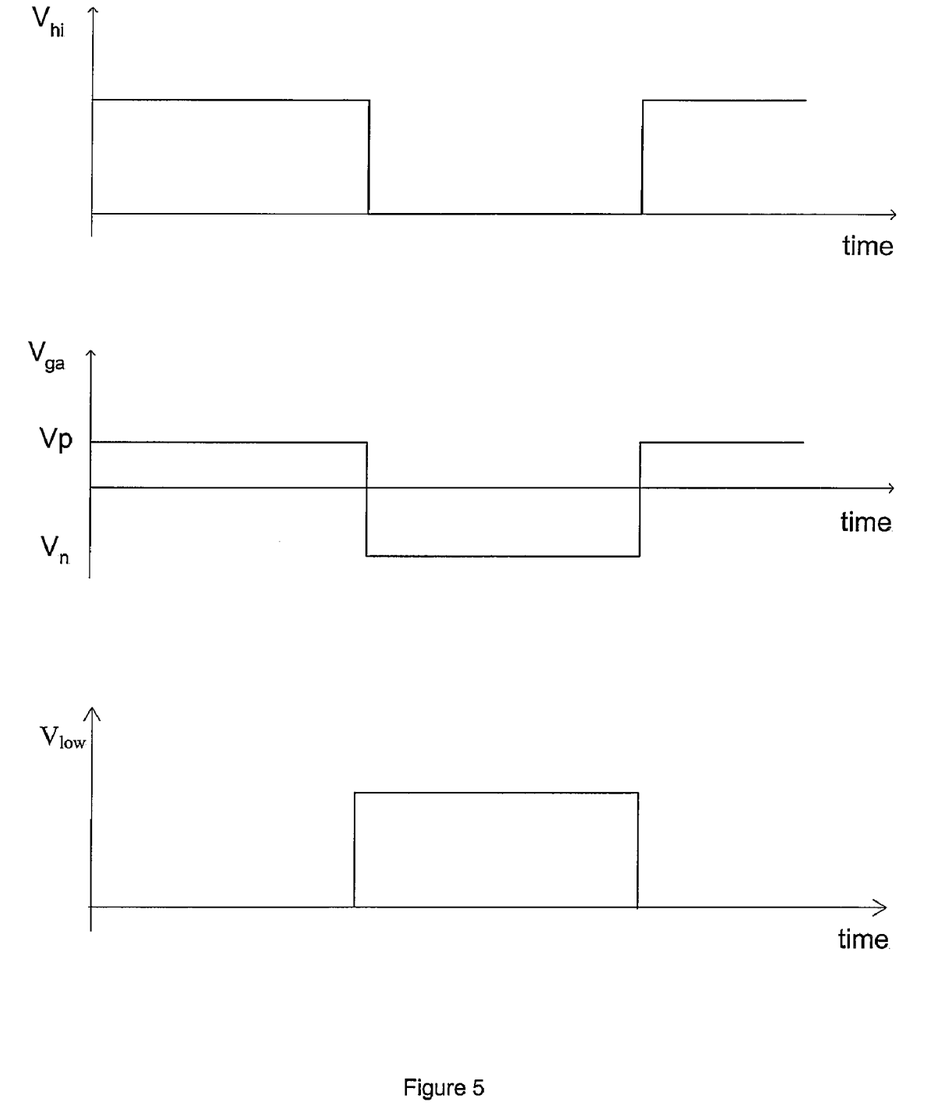

Referring briefly to FIG. 5, as is known per se, the voltage $V_{hi}$ output by the high side driver 27 is (ideally) a square wave that is switched over time between a relatively high positive value (of e.g. 5V) and a zero value, as shown in the upper part of FIG. 5. As shown in the lower part of FIG. 5, the driver signal $V_{low}$ output by the low side driver 29 is in general the opposite of the drive signal output by the high side driver 27, i.e. when the output of the high side driver 27 is high, the output of the low side driver 29 is low and vice versa. It will be understood that when the high side voltage $V_{hi}$ is high, the low side voltage $V_{low}$ is normally zero though it may be small positive or negative. Similarly, it will be understood that when the low side voltage $V_{low}$ is high, the high side voltage $V_{hi}$ is normally zero though it may be small positive or negative.

When the high side gate drive signal $V_{hi}$ is high, as is known per se the high side switch 23 is on. During this period, the capacitor 31 charges with a current $i_a$ through the one or more diodes 33. If the forward bias voltage drop across each diode 33 is $V_f$ and the number of diodes 33 is $N_d$, then the voltage $V_{ga}$ developed on the second side of the capacitor, which is applied to the anode gate 32 of the dual gate device 24, is at least $N_d \cdot V_f$ above the voltage at the mid point 26. By way of example, if there are two diodes 33 each with a forward bias drop of 0.7V, then at least +1.4V relative to the voltage at the mid point 26 is developed and can be applied to the anode gate 32 of the dual gate device 24 during the period that the high side gate drive signal $V_{hi}$ is high. This is shown in the middle trace of the timing diagram of FIG. 5 which shows $V_{ga}$ varying with $V_{hi}$ and the maximum value $V_p$ of $V_{ga}$.

The effect of this is as follows. The high side gate drive signal $V_{hi}$ is high so the high side switch 23 is on. The low side gate drive signal is low so the voltage applied to the cathode gate 30 of the dual gate device 24 (measured relative to the voltage applied to the cathode) is low (or zero). The voltage $V_{ga}$, which is applied to the anode gate 32 of the dual gate device 24 and which is effectively obtained from the high side driver 27, is positive relative to the voltage of the mid point 26. With these relative voltages applied to the anode and the cathode gate 30 and the anode gate 32 of the dual gate device 24, the dual gate device 24 is operating as an anti-parallel diode and reverse-conducting.

In the next part of the cycle, when the high side gate drive signal $V_{hi}$ is low, as is known per se the high side switch 23 is off. At this time, the first side of the capacitor 31 (i.e. the side connected to the high side driver 27) is tied to the mid point 26 of the circuit 20. Now, the capacitor 31 is already charged (from the previous high portion of the cycle of the high side driver 27) and has a lower voltage on its second side compared to its first side. This means that the voltage $V_{ga}$ that is now applied to the anode gate 32 of the dual gate device 24 is now effectively negative (as it is measured relative to the voltage applied to the anode of the dual gate device 24, which of course is the voltage at the mid point 26). Again, this is shown in the middle trace of the timing diagram of FIG. 5 which shows $V_{ga}$ varying with $V_{hi}$ and the minimum value $V_n$ of $V_{ga}$. In this specific example, $V_n = -(5-1.4)V = -3.6V$.

The effect of this is as follows. The high side gate drive signal $V_{hi}$ is low so the high side switch 23 is off. The low side gate drive signal is high so the voltage applied to the cathode gate 30 of the dual gate device 24 (measured relative to the voltage applied to the cathode) is high. The voltage $V_{ga}$, which is applied to the anode gate 32 of the dual gate device 24 and which is effectively obtained from the high side driver 27, is negative relative to the voltage of the mid point 26. With these relative voltages applied to the anode and the cathode gate 30 and the anode gate 32 of the dual gate device 24, the dual gate device 24 is operating in LIGBT mode and is forward-conducting.

Thus, by use of simple passive circuit components, in this example a capacitor and one or more diodes, the same high side driver can be used to drive both the control gate of a high side device and one control gate, such as an anode gate, of a dual gate device being used as a low side device in a half bridge circuit.

It will be understood that the principles described above may be applied to any suitable dual gate device when used as a low side switch in a half bridge circuit such that one control gate of the dual gate device can be controlled by a conventional low side driver and the other control gate of the dual gate device can be controlled effectively by the high side driver which is also used to control the high side switch.

The half bridge circuit described above may be duplicated to form a full bridge circuit, or may be combined with a conventional half bridge circuit to form a full bridge circuit.

Embodiments of the present invention have been described with particular reference to the examples illustrated. However, it will be appreciated that variations and modifications may be made to the examples described within the scope of the present invention.

The invention claimed is:

1. A half bridge circuit, the circuit comprising:
   a first semiconductor switch having at least one control gate;
   a second semiconductor switch having at least two control gates;
   a first driver having an output connected to a control gate of the first semiconductor switch for selectively applying a first control voltage to the control gate of the first semiconductor switch; and,
   a second driver having an output connected to a first control gate of the second semiconductor switch for selectively applying a second control voltage to said first control gate of the second semiconductor switch;
   the output of the first driver being connected to a second control gate of the second semiconductor switch by a circuit arrangement such that when the first driver is operated to apply a high, positive voltage to the control gate of the first semiconductor switch, a positive voltage is applied to said second control gate of the second semiconductor switch, and such that when the first driver is operated to apply a low, zero or small voltage to the control gate of the first semiconductor switch, a negative voltage is applied to said second control gate of the second semiconductor switch.

2. A circuit according to claim 1, wherein the circuit arrangement that connects the output of the first driver being connected to the second control gate of the second semiconductor switch contains passive components only.

3. A circuit according to claim 1, wherein the circuit arrangement that connects the output of the first driver to the second control gate of the second semiconductor switch contains at least one diode and at least one capacitor, one side of the capacitor being connected to the output of the first driver, the other side of the capacitor being connected to the second control gate of the second semiconductor switch, the other side of the capacitor being connected via said at least one diode to a midpoint of the circuit, a high voltage terminal of the second semiconductor switch being connected to the midpoint of the circuit, whereby when the output of the first driver is high, the capacitor charges via said at least one diode so as to present a positive voltage to the second control gate of the second semiconductor switch, and when the output of the first driver is low, the capacitor presents a negative voltage to the second control gate of the second semiconductor switch.

4. A circuit according to claim 2, wherein the circuit arrangement that connects the output of the first driver to the second control gate of the second semiconductor switch contains at least one diode and at least one capacitor, one side of the capacitor being connected to the output of the first driver, the other side of the capacitor being connected to the second control gate of the second semiconductor switch, the other side of the capacitor being connected via said at least one diode to a midpoint of the circuit, a high voltage terminal of the second semiconductor switch being connected to the midpoint of the circuit, whereby when the output of the first driver is high, the capacitor charges via said at least one diode so as to present a positive voltage to the second control gate of the second semiconductor switch, and when the output of the first driver is low, the capacitor presents a negative voltage to the second control gate of the second semiconductor switch.

5. A circuit according to claim 1, wherein the second semiconductor switch is a dual gate inversion layer emitter transistor.

6. A circuit according to claim 2, wherein the second semiconductor switch is a dual gate inversion layer emitter transistor.

7. A circuit according to claim 3, wherein the second semiconductor switch is a dual gate inversion layer emitter transistor.

8. A circuit according to claim 4, wherein the second semiconductor switch is a dual gate inversion layer emitter transistor.

9. A method of operating a half bridge circuit that has a first semiconductor switch having at least one control gate; a second semiconductor switch, the second semiconductor switch having at least two control gates; a first driver having an output connected to a control gate of the first semiconductor switch for selectively applying a first control voltage to the control gate of the first semiconductor switch; and, a second driver having an output connected to a first control gate of the second semiconductor switch for selectively applying a second control voltage to said first control gate of the second semiconductor switch; the output of the first driver being connected to a second control gate of the second semiconductor switch by a circuit arrangement; the method comprising:
   operating the first driver to apply a high, positive voltage to the control gate of the first semiconductor switch, whereby a positive voltage is applied to said second control gate of the second semiconductor switch, and operating the first driver to apply a low, zero or small voltage to the control gate of the first semiconductor switch, whereby a negative voltage is applied to said second control gate of the second semiconductor switch.

10. A method according to claim 9, wherein the circuit arrangement that connects the output of the first driver being connected to the second control gate of the second semiconductor switch contains passive components only.

11. A method according to claim 9, wherein the circuit arrangement that connects the output of the first driver to the second control gate of the second semiconductor switch contains at least one diode and at least one capacitor, one side of the capacitor being connected to the output of the first driver, the other side of the capacitor being connected to the second control gate of the second semiconductor switch, the other side of the capacitor being connected via said at least one diode to a midpoint of the circuit, a high voltage terminal of the second semiconductor switch being connected to the midpoint of the circuit, whereby when the output of the first driver is high, the capacitor charges via said at least one diode so as to present a positive voltage to the second control gate of the second semiconductor switch, and when the output of the first driver is low, the capacitor presents a negative voltage to the second control gate of the second semiconductor switch.

12. A method according to claim 10, wherein the circuit arrangement that connects the output of the first driver to the second control gate of the second semiconductor switch contains at least one diode and at least one capacitor, one side of the capacitor being connected to the output of the first driver, the other side of the capacitor being connected to the second control gate of the second semiconductor switch, the other side of the capacitor being connected via said at least one diode to a midpoint of the circuit, a high voltage terminal of the second semiconductor switch being connected to the midpoint of the circuit, whereby when the output of the first driver is high, the capacitor charges via said at least one diode so as to present a positive voltage to the second control gate of the second semiconductor switch, and when the output of the first driver is low, the capacitor presents a negative voltage to the second control gate of the second semiconductor switch.

13. A method according to claim 9, wherein the second semiconductor switch is a dual gate inversion layer emitter transistor.

14. A method according to claim 10, wherein the second semiconductor switch is a dual gate inversion layer emitter transistor.

15. A method according to claim 11, wherein the second semiconductor switch is a dual gate inversion layer emitter transistor.

16. A method according to claim 12, wherein the second semiconductor switch is a dual gate inversion layer emitter transistor.

* * * * *